(12) United States Patent
Hermeling et al.

(10) Patent No.: US 9,720,025 B2
(45) Date of Patent: Aug. 1, 2017

(54) ISOLATION MONITORING USING A TEST SIGNAL OF VARIABLE FREQUENCY

(71) Applicant: SMA Solar Technology AG, Niestetal (DE)

(72) Inventors: Dirk Hermeling, Petershagen (DE); Reinhard Lehmann, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 684 days.

(21) Appl. No.: 14/085,903

(22) Filed: Nov. 21, 2013

(65) Prior Publication Data

US 2014/0097854 A1 Apr. 10, 2014

Related U.S. Application Data

(63) Continuation of application No. PCT/EP2012/059650, filed on May 24, 2012.

(30) Foreign Application Priority Data

May 24, 2011 (DE) .................. 10 2011 050 590

(51) Int. Cl.
    *G01R 31/02* (2006.01)
    *G01R 27/02* (2006.01)
    *G01R 27/18* (2006.01)

(52) U.S. Cl.
    CPC ......... *G01R 31/025* (2013.01); *G01R 27/025* (2013.01); *G01R 27/18* (2013.01)

(58) Field of Classification Search
    CPC ..... G01R 31/025; G01R 27/025; G01R 27/18
    See application file for complete search history.

(56) References Cited

U.S. PATENT DOCUMENTS 3,904,839 A * 9/1975 Peoples .................... H04B 3/46
                                             324/520
3,976,987 A 8/1976 Anger
(Continued)

FOREIGN PATENT DOCUMENTS

DE            654673 A1    1/2006
DE    102006019467 A1    12/2007
(Continued)

OTHER PUBLICATIONS

Liwei Li, et al.; "Research on the New Clamp-on Ground Resistance On-Line Tester Based on AC Variable Frequency"; Proceeding of the 6th World Congress on Intellectual Control and Automation; Jun. 21-23, 2006, Dalian, China, p. 1-4.
(Continued)

*Primary Examiner* — David M Gray
*Assistant Examiner* — Michael Harrison
(74) *Attorney, Agent, or Firm* — Eschweiler & Potashnik, LLC

(57) ABSTRACT

In monitoring an isolation of an ungrounded power grid an AC voltage source is connected to the power grid via at least one test resistor. A test signal with a periodic continuous voltage course with regard to ground and with a frequency is applied to the power grid by means of the AC voltage source. A leakage current flowing due to the test signal is measured; and an ohmic isolation resistance is determined from the leakage current. The frequency of the test signal is varied such that an active current part of the leakage current keeps a predetermined recommended value at varying leakage capacitances of the power grid. This provides for a desired level of accuracy at maximum speed of isolation or ground fault detection.

23 Claims, 1 Drawing Sheet

(56) References Cited

U.S. PATENT DOCUMENTS

| | | | |
|---|---|---|---|
| 3,978,465 A | 8/1976 | Goode | |
| 4,066,950 A | 1/1978 | Rumold et al. | |
| 4,200,835 A | 4/1980 | Anahara et al. | |
| 4,896,115 A | 1/1990 | LeMaitre et al. | |
| 8,139,383 B2 | 3/2012 | Efraimsson et al. | |
| 2008/0300807 A1* | 12/2008 | Marti | G01R 31/027 702/66 |
| 2012/0014020 A1* | 1/2012 | Lehmann | G01R 31/025 361/42 |
| 2012/0126839 A1 | 5/2012 | Schaefer et al. | |

FOREIGN PATENT DOCUMENTS

| | | |
|---|---|---|
| EP | 593007 A2 | 1/2006 |
| JP | 09285015 A | 10/1997 |
| JP | 2003-090859 | 3/2003 |
| JP | 2003232821 | 8/2003 |
| JP | 2006187150 A | 8/2006 |
| JP | 2008-020322 | 1/2008 |

OTHER PUBLICATIONS

International Search Report for PCT/EP2012/059650 dated Aug. 22, 2012, p. 1-12.

* cited by examiner

ISOLATION MONITORING USING A TEST SIGNAL OF VARIABLE FREQUENCY

CROSS REFERENCE TO RELATED APPLICATIONS

This application is a continuation application of international application PCT/EP2012/059650, filed on May 24, 2012, which claims priority to German Patent Application No. DE 10 2011 050 590.3 entitled, "Isolationsüberwachung mit einem Prüfsignal variabler Frequenz" and filed on May 24, 2011.

FIELD

The disclosure relates to a method of monitoring an isolation of an ungrounded power grid. More particular, the disclosure relates to a method of and an apparatus for monitoring an isolation of an ungrounded power grid.

BACKGROUND

An ungrounded power grid without a fixed relation to electric ground of any of its lines may also be designated as an IT (French: isolée terre) grid. In such a power grid, an isolation fault between one of the lines and ground only results in this line being grounded, and the power grid may still be operated. However, such an isolation fault should be detected as soon as possible to be able to repair it before any further isolation fault occurs which would force a shutdown of the power grid.

In an IT grid, an isolation fault with regard to ground may be detected by measuring and evaluating the impedance to ground. The impedance to ground is a complex value which is composed of the ohmic isolation resistance of interest as its real part and of a capacitive reactance to ground as its imaginary part. The capacitive reactance to ground is a result of leakage capacitances of the power grid which are effective with respect to ground.

IT grids are often used in photovoltaic systems. Due to the surface area of their solar modules alone, photovoltaic systems exhibit high leakage capacitances with regard to ground. The value of these leakage capacitances varies considerably when, for example, rain falls on the photovoltaic system. Due to high and at the same time varying leakage capacitances, monitoring an isolation of a photovoltaic system operated as an IT grid with regard to ground becomes quite complicated. Further, voltage variations occurring over the respective photovoltaic generator due to MPP tracking may also cause problems in isolation monitoring of photovoltaic systems.

A method of and an apparatus for monitoring an isolation of an ungrounded power grid are known from DE 25 42 811 B1. Here, a sine-shaped test signal having a frequency in a preferred range from 25 Hz to 500 Hz is applied to a measurement object by means of an AC voltage source. A voltage drop over a resistor connected in series with the AC voltage source is used as a measure for the leakage current caused by the test signal. The leakage current is supplied to a rectifier circuitry operating in phase with the test signal to determine the active current part of the leakage current which is in phase with the test signal. The known method and the known apparatus turn out to be suitable to only a very limited extent for isolation monitoring of a photovoltaic system operated as an IT grid as the active current part of the leakage current is comparatively small and may thus only be determined with a comparatively high error.

A further method of and a further apparatus for monitoring the isolation of an ungrounded power grid are known from DE 38 82 833 D2. Here, it is indicated that, in case of an AC current grid being monitored, the test signal applied to the IT grid should have a frequency below the frequency of the AC current and that the frequency should be so low that the current flowing over the leakage capacitance of the power grid monitored is minimized. For example, a frequency of 10 Hz is mentioned. This reactive current part of the leakage current is then compensated for determining the isolation resistance.

In a method of and an apparatus for monitoring an isolation of ungrounded DC and AC power grids which are known from EP 0 654 673 A1, a test signal having a square wave voltage course is applied to the power grid to be monitored by means of a voltage source. Based on the resulting leakage current, the absolute value of the isolation resistance between the measurement object and ground is determined. Due to using a square wave voltage course, transient effects, particularly the loading of any capacitances with respect to ground in the power grid to be monitored, have to be awaited before the leakage current is measured. Due to this, the measurement of the isolation resistance is very slow when high capacitances are present. One tries to compensate for this by applying the next voltage step to the test signal as soon as the previous transient effects have ended and the leakage current has been measured. With high leakage capacitances, however, a single measurement of the isolation resistance may nevertheless take some time in the order of minutes. This is not sufficient for quickly detecting an isolation fault.

Thus, there still is a need of a robust and quickly responding method of and apparatus for monitoring an isolation of an ungrounded power grid which securely detects occurring isolation faults even when high and particularly when varying leakage capacitances are present.

SUMMARY

The present disclosure relates to a method of monitoring an isolation of an ungrounded power grid. In this method, an AC voltage source is connected to the power grid via at least one test resistor. A test signal comprising a periodic continuous voltage course with regard to ground and a frequency is applied to the power grid by means of the AC voltage source. A leakage current flowing due to the test signal is measured and an ohmic isolation resistance is determined from the leakage current. The frequency of the test signal is varied such that an active current part of the leakage current keeps a predetermined recommended value at varying leakage capacitances of the power grid.

The present disclosure also relates to an apparatus for monitoring an isolation of an ungrounded power grid. This apparatus comprises (i) an AC voltage source configured to be connected to the power grid via at least one test resistor and generating a test signal having a periodic continuous voltage course with regard to ground and a frequency, (ii) measurement devices measuring a leakage current flowing due to the test signal, and (iii) an evaluation device which determines an ohmic isolation resistance from the leakage current. The AC voltage source varies the frequency of the test signal in such a way that an active current part of the leakage current keeps a predetermined recommended value at varying leakage capacitances of the power grid.

That the active current part of the leakage current keeps a predetermined recommended value means that it stays within a limited range of values, and provides for a desired level of accuracy at maximum speed of isolation or ground fault detection.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

Figure 1:
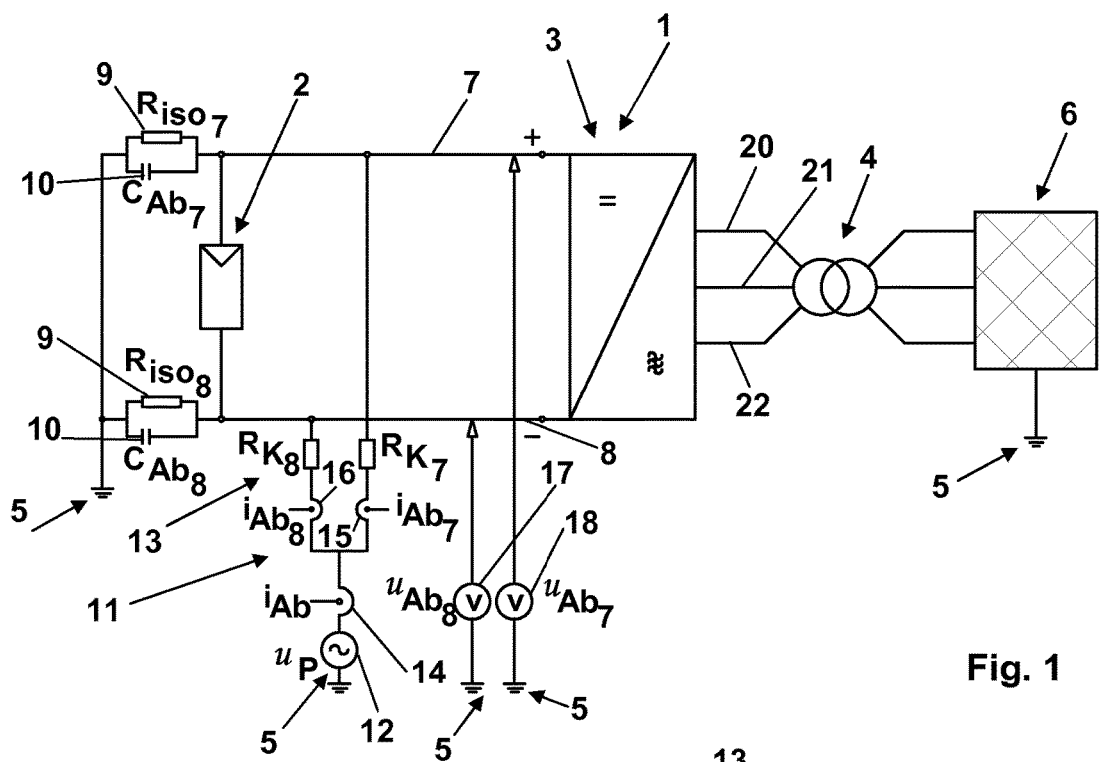
FIG. 1 schematically shows a photovoltaic system comprising an inverter and being operated as an IT grid, together with an AC voltage source and measurement devices of an apparatus for monitoring the isolation of the IT grid.

The disclosure relates to a method of monitoring an isolation of an ungrounded power grid. More particular, the disclosure relates to a method of and an apparatus for monitoring an isolation of an ungrounded power grid, comprising the steps of connecting an AC voltage source via at least one test resistor to the power grid; applying a test signal comprising a periodic continuous voltage course with regard to ground and a frequency to the power grid by means of the AC voltage source; measuring a leakage current flowing due to the test signal; and determining an ohmic isolation resistance from the leakage current.

Further, the disclosure relates to an apparatus for monitoring an isolation of an ungrounded power grid. More particular, the disclosure relates to an apparatus for monitoring an isolation of an ungrounded power grid comprising: an AC voltage source configured to be connected to the power grid via at least one test resistor and generating a test signal having a periodic continuous voltage course with regard to ground and a frequency; measurement devices measuring a leakage current flowing due to the test signal; and an evaluation device determining an ohmic isolation resistance from the leakage current.

The ungrounded power grid may be a DC or an AC power grid; it may also have both a DC area, like for example on the input side of an inverter, and an AC area, like for example on the output side of the inverter.

The ungrounded power grid may be a so-called IT (French: isolée terre) grid, particularly in a photovoltaic system, or any other ungrounded power grid.

In the method for monitoring an isolation of an ungrounded power grid disclosed here the frequency of the test signal is not fixed but will be adapted to the leakage capacitances of the power grid which are presently effective. This adaptation may be effected in a number of different ways, for example, by repeatedly or continuously modulating the frequency of the test signal. In any case, the purpose of the variation of the frequency of the test signal is to maintain the active current part of the leakage current at a high level such that the predetermined recommended value is achieved. In this way, it is ensured that the isolation resistance of the monitored power grid can be determined with sufficient accuracy and reliability. At the same time, this determination also is carried out within a minimum amount of time by varying the frequency of the test signal downwards to such an extent only that is required for achieving sufficient precision and reliability. In other words, the time required to react to a changing isolation resistance and particularly to an isolation fault would be unnecessarily long, if the recommended value is exceeded, which is anyway not necessary for achieving a sufficient accuracy and reliability. Hence, in the method disclosed here, the time required to react to a changing isolation resistance and particularly to an isolation fault is kept as short as possible by keeping the recommended value. On the one hand, the recommended value is a minimum value which the active current part reaches in the method disclosed here; on the other hand, however, it is a target value which is not exceeded unnecessarily.

Particularly, the predetermined recommended value of the active current part of the leakage current may be a relative effective value of the active current part of the leakage current in relation to the entire leakage current, which is kept within a predetermined relative window, i.e. particularly within a percentage window or a limited range of percentage values. The relation of the relative effective value of the active current part of the leakage current and the entire leakage current directly corresponds to a phase angle of the leakage current with regard to the causative test signal. Depending on the levels of accuracy and reliability on the one hand, and the reaction time to be realized at the same time on the other hand, the recommended value for the active current part of the leakage current may be determined as a relative effective value of the active current part of the leakage current in relation to the entire leakage current and may be in a typical percentage range from 0.1% to 50%. In one embodiment, this recommended value is about 10%, corresponding to a phase angle of about 80°. Under particular circumstances, the recommended value may also be set to less than 0.1% or more than 50%. It will be appreciated that it is not required to further increase the frequency of the test signal according to the value recommended for the active current part if a low ohmic isolation fault has already been detected. Instead, the frequency of the test signal may be limited to a maximum value. This maximum value may be set such that it is not reached without a low ohmic isolation fault having already been detected.

In the method disclosed here, the frequency of the test signal may continuously be varied according to a tracking method such that the recommended value of the active current part of the leakage current is always kept as close as possible. For finding the frequency required for keeping the recommended value, the frequency of the test signal may also be repeatedly swept through an extended range of frequencies. It is also possible to continuously modulate the frequency of the test signal. It has, however, to be considered that during sweeping or modulating the frequency, at all frequencies of the test signal which do not comply with the recommended value, no optimum measurement conditions are achieved, as either—at a too low frequency—the method reacts slower than desired to an isolation fault, or—at a too high frequency—the method operates less accurate than desired.

In a particular embodiment of the method disclosed here, the amplitude of the test signal is also modulated. The amplitude modulation can take place in such a way that an electric power fed by the AC voltage source is kept constant despite its basic variation with the frequency modulation. Alternatively, the amplitude modulation can be used to keep constant (i) an absolute effective value of the active current part of the leakage current or (ii) an absolute active power value of the power of the AC voltage source or (iii) a relative active power value of the AC voltage source with regard to its entire electric power.

Further, the modulation of the frequency and/or the amplitude of the test signal may in an advantageous way be used to determine a cross-correlation between the test signal and the leakage current caused by the test signal. A resemblance determined by means of cross-correlation corresponds to the absolute value of the complex leakage impedance, whereas a time shift between the test signal and the leakage current corresponds to the phase angle of the complex leakage impedance.

Alternatively or additionally, the leakage current may be multiplied by a reference function which is in phase with the test signal $u_P$. The product of this multiplication may then be averaged over an integer number of periods of the reference function. If the test signal is a sine signal and if the reference function is a sine function having a peak value of $\sqrt{2}$, for example, the resulting average value directly corresponds to the effective value of the active current part of the leakage current. In a similar way, the reactive current part of the leakage current may also be determined by multiplying the leakage current by a further reference function, which has a phase offset of $\pi/2$ with regard to the test signal and by averaging the product of the multiplication over an integer number of periods of a further reference function. In case of a sine signal as the test signal, a cosine function may be used as the further reference function, again preferably with a peak value of $\sqrt{2}$. In practice, averaging the respective product may also be realized by low pass filtering.

Since the test signal only varies continuously in one embodiment, steps of the leakage current, particularly of the active current part of the leakage current, are not caused by the test signal but are an indication of an isolation fault. Such an isolation fault is of course also always present when the active current part of the leakage current exceeds a threshold value or when the isolation resistance determined on basis of the leakage current drops below a threshold value.

When applying the method disclosed here to a photovoltaic system which includes an inverter whose AC current side up to a transformer is ungrounded, the AC voltage source is in one embodiment connected to the power grid on the DC current side of the inverter. Generally, however, it may also be connected to the individual lines of the power grid on the AC current side of the inverter. Here, additional information about the isolation state of the power grid and particularly about the location of a present isolation fault may be obtained by means of further measurements. Even when executing the method described here on the DC current side of the inverter only, isolation faults on the AC current side of the inverter are also detected as long as the operating inverter (alternately) galvanically connects the lines on its DC current side with the lines on its AC current side. For localizing an isolation fault to the DC current or AC current side of the inverter it is then sufficient to stop the operation of the inverter so that its AC current side is galvanically separated from its DC current side. If the isolation fault is then no longer detected from its DC current side it is on the AC current side. If the isolation fault, however, is still detected from the DC current side it is on the DC current side.

Additional information about the isolation state of the power grid may also be obtained by determining partial currents from the individual lines of the power grid which are isolated with regard to each other. The partial currents may be determined directly between the voltage source and the individual lines of the power grid or indirectly based on electric voltages of the individual lines with regard to ground. Evaluating the partial currents allows for allocating a detected isolation fault to an individual line of the power grid. This, at least, applies to isolated, i.e. galvanically separated lines of the power grid. In a power grid comprising a photovoltaic generator, this isolation does not exist in operation. As soon as the photovoltaic generator is inactive and nonconductive, like during the night, this isolation, however, is present, and at least then isolation faults may be localized in the way described. Such a localization may also be achieved during the day by means of switches arranged in the individual lines between the photovoltaic generator and the inverter. If these switches are opened one by one and if the partial currents form the individual lines of the power grid are at the same time measured on the DC current side, it can be determined on which side of the respectively opened switch the isolation fault is situated.

Referring now in greater detail to the drawings, FIG. 1 schematically shows a photovoltaic system 1 set up as an IT grid, i.e. as a power grid isolated with respect to electric ground 5 and extending from a photovoltaic generator 2 over an inverter 3 up to a transformer 4. From the photovoltaic generator 2 up to the inverter 3, the IT grid is a DC power grid, and from the inverter 3 up to the transformer 4, the IT grid is an AC power grid. Via the transformer 4, the photovoltaic system 1 feeds electric energy from the photovoltaic generator 2 into a public AC power grid 6, which has a fixed reference to ground 5. The isolation resistances $R_{iso7}$ und $R_{iso8}$ of the input lines 7 and 8 of the inverter 3 with respect to ground 5 are represented by ohmic resistors 9 in FIG. 1. These ohmic resistors 9 are connected in parallel to capacitors 10, which represent the leakage capacitances $C_{ab7}$ und $C_{ab8}$ of the input lines 7 and 8 with respect to ground. These leakage capacitances $C_{ab7}$ und $C_{ab8}$ essentially result from the large surface area of the solar modules of the photovoltaic generator 2.

If there is an isolation fault in one of the input lines 7 or 8, i.e. when one of the isolation resistances $R_{iso7}$ or $R_{iso8}$ becomes too small so that an earth fault occurs, the photovoltaic system 1 does not necessarily shut down completely. Often, switching off the inverter 3 is sufficient to avoid high leakage currents from flowing as the second input line and thus the second pole of the photovoltaic generator 2 is still isolated with regard to ground 5. For switching off the inverter 3 and in any case for repairing the ground fault, however, this ground fault has to be detected as soon as possible. To this end, an apparatus 11 is provided. This apparatus 11 comprises an AC voltage source 12 by which a test signal comprising a periodic continuous voltage course with regard to ground 5 is applied to the power grid on the DC current side of the inverter 3 of the photovoltaic system 1 via a coupling network 13 comprising two test resistors $R_{K7}$ and $R_{K8}$. A leakage current $i_{Ab}$ flowing in the coupling network due to the test signal $u_P$ is measured by means of a measuring device 14 being an amperemeter here. Additionally, partial currents $i_{Ab7}$ and $i_{Ab8}$ flowing through the test resistors $R_{K7}$ and $R_{K8}$ are measured by measurement devices 15 and 16 also being amperemeters. Alternatively, the voltages $u_{Ab7}$ and $u_{Ab8}$ between the input lines 7 and 8, respectively, and ground 5 are measured by means of measurement devices 17 and 18 being voltmeters. The test signal $u_P$ may consist of a sine-shaped AC voltage with regard to ground whose amplitude may be modulated. In each case the test signal comprises a periodic continuous voltage course with regard to ground, and it can be varied with regard to its frequency. This variation may be made as a chirp or as wavelets; in one embodiment, however, it is a continuous variation, or the frequency is kept constant after its optimum value has been determined by means of a chirp or by means of wavelets up to the next chirp or wavelet.

The currents or voltages measured by the measurement devices 14 to 18 depend on the isolation resistances $R_{iso7}$ and $R_{iso8}$ as well as on the leakage capacitances $C_{Ab7}$ and $C_{Ab8}$ and the frequency of the test signal $u_P$. Particularly, the AC current resistance and the leakage reactance $X_C$ depend on the leakage capacitances $C_{Ab7}$ and $C_{Ab8}$ according to $X_C=1/(2\pi f^*C_{Ab})$, wherein f is the frequency of the test signal $u_P$. With very high leakage capacitances $C_{Ab}$, the capacitive leakage reactance $X_C$ becomes small and, correspondingly, the test signal $u_P$ causes high leakage currents over the leakage capacitances $C_{Ab7}$ and $C_{Ab8}$ as compared to the relative high isolation resistances $R_{iso7}$ and $R_{iso8}$. This hinders the determination of the isolation resistances $R_{iso7}$ and $R_{iso8}$ based on the measured leakage currents $i_{Ab}$ to be at a sufficiently high accuracy. When the frequency f of the test signal $u_P$ is reduced, the leakage reactance $X_C$ increases, which means that the leakage currents over the leakage capacitances $C_{Ab7}$ and $C_{Ab8}$ become smaller and that the leakage currents through the isolation resistances $R_{iso7}$ and $R_{iso8}$ become higher from a relative point of view. With an overall power of the test signal $u_P$ being kept constant which, in the present case, even allows for increasing the amplitude of the test signal $u_P$ with increasing frequency of the test signal, the leakage currents flowing through the isolation resistances $R_{iso7}$ and $R_{iso8}$ also increase from an absolute point of view. A reduction of the frequency f of the test signal $u_P$, however, results in that the determination of the isolation resistances $R_{iso7}$ and $R_{iso8}$ becomes slower and that thus changes in the isolation resistances $R_{iso7}$ and $R_{iso8}$ are not being detected quickly. For this reason, an optimization of the frequency f of the test signal $u_P$ is carried out to ensure that the leakage currents are high enough for a determination of the isolation resistances $R_{iso7}$ and $R_{iso8}$ on the one hand, and to keep the time required by the test for reacting to changes of the isolation resistances short, on the other hand.

Figure 2:
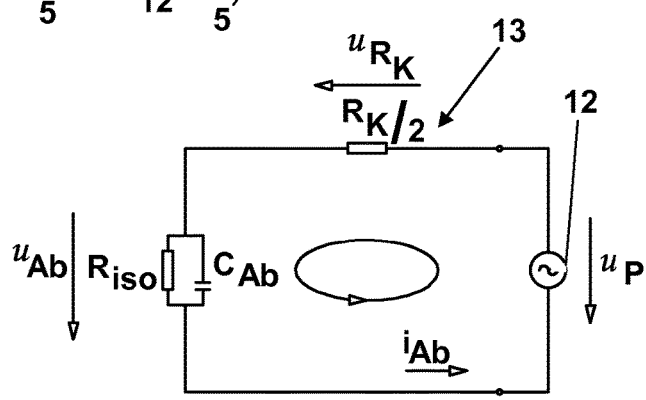
FIG. 2 shows a simplified equivalent circuit diagram for determining the voltage present between the IT grid according to FIG. 1 and electric ground.

The simplified equivalent circuit diagram according to FIG. 2 illustrates how a voltage drop $u_{Rk}$ over the coupling network 13 is deducible from the measured leakage current $i_{Ab}$ and the values of the test resistors $R_k$ of the coupling network 13. According to the mesh rule one may then determine the voltage drop $u_{Ab}$ over the isolation resistance $R_{iso}$ and the leakage capacitance $C_{Ab}$ connected in parallel. In this way, the current $i_{Ab}$ and the voltage $u_{ab}$ are available for determining the values of $R_{iso}$ and $C_{Ab}$. Alternatively, the voltage $u_{Ab}$ may also be measured directly. This, however, requires some effort due to the high output voltage of the photovoltaic generator 2 according to FIG. 1 and only provides a low accuracy. The voltage $u_{Rk}$ dropping over the coupling network 13, however, may also be directly measured at low effort.

Figure 3:
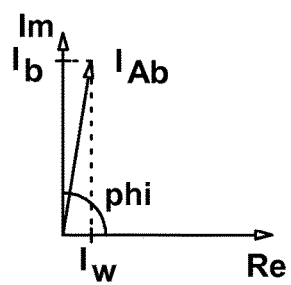
FIG. 3 is a vector diagram of the complex leakage current $I_{Ab}$, composed of an active current part $I_w$ as its real part and a reactive current part $I_b$ as its imaginary part.

In the same way as the isolation impedance Z resulting from $u_{Ab}$ and $i_{Ab}$ is a complex value, which consists of the isolation resistance R as its real part and the leakage reactance $X_C$ as its imaginary part, the leakage current $i_{Ab}$ also is a complex value which consists of the active current part $I_w$ as its real part and the reactive current part $I_b$, i.e. of the capacitive leakage current, as its imaginary part (see FIG. 3). The effective value of the real part $I_b$ may be determined by multiplying the time-dependent measurement value of $i_{Ab}$ by a sine function which is in phase with the test signal $u_P$. Correspondingly, the effective value of the imaginary part $I_b$ may be obtained by multiplying the time dependent measurement value of $i_{Ab}$ with a reference signal which comprises a phase offset with regard to the test signal $u_P$ of $\pi/2$. In this way, one, however, only obtains a sufficiently accurate value for $I_w$ if $I_w$ is sufficiently high in relation to the capacitive leakage current, i.e. to the reactive current part $I_b$ of $I_{Ab}$. This is ensured by tuning the frequency of the test signal $u_P$ according to the method disclosed here. In other words, by means of a sufficiently small frequency it is assured that the reactive current part $I_b$ does not too strongly exceed the active current part $I_w$ of the leakage current $I_{Ab}$ in the parallel circuit of $R_{iso}$ and $C_{Ab}$, since otherwise already a small variation of the phase angle $\phi$ between the active power part $I_w$ and the reactive power part $I_b$ of the leakage current $I_{Ab}$, for example caused by a change of the leakage capacitance due to rain fall on the photovoltaic system, would have a strong effect on the accuracy in determining the reactive power part $I_b$ and the real part R of interest of the isolation impedance Z.

At a frequency f of the test signal $u_P$ which is optimized also with regard to a quick detection of isolation faults, the phase angle $\phi$ between the active current part and the reactive current part of the leakage current only shows a little dependency on the value of the isolation resistance R of interest due to the typical relations between a relative high isolation resistance R and a relative small leakage reactance $X_C$ in a photovoltaic system. Particularly, the method described here does without determining the phase angle $\phi$ by multiplying the digitized signals $u_{Ab}$ and $i_{Ab}$ each by a sine signal or a cosine signal, respectively, which are in phase with the test signal $u_P$, and low-pass filtered afterwards. The DC values obtained in this way represent virtual active parts ($U_w$ and $I_w$ from the multiplication with the reference sine) and reactive parts ($U_b$ and $I_b$ from the multiplication with the reference cosine) of the power coupled in by means of the test signal. From these values, virtual powers may be calculated:

$$P=U_w*I_w+U_b*I_b$$

$$Q=U_w*I_b-U_b*I_w$$

From the virtual powers, the complex impedance Z with its resistive and reactive parts $R_{iso}$ and $X_C$ may be determined from the effective value of the voltage between the photovoltaic generator and ground as follows:

$$R_{iso}=U_{eff}^2/P$$

$$X_C=U_{eff}^2/Q$$

In the method disclosed here, the measurement values of $i_{Ab}$, after being digitized, may also be evaluated by calculating a cross-correlation with regard to a test signal $u_P$ which is modulated with regard to its frequency and/or its amplitude, wherein a time shift of $i_{Ab}$ with regard to $u_P$ which corresponds to the phase angle $\phi$ between the active current part and the reactive current part, and a resemblance between the test signal $u_P$ and the measured signal $i_{Ab}$ which corresponds to the complex isolation impedance Z are determined. With regard to the voltage course of the test signal $u_P$, particularly tuned wavelets are suitable here, like for example wavelets having a sine-shaped carrier and a modulation in a frequency range von 0.1 to 1 Hz with amplitudes of 0 to 30 Volt. Generally, it is suitable to keep the amplitude of the test signal $u_P$ below the safety extra-low voltage of 50 Volt.

The sensitivity of the method disclosed here ensured by tuning the frequency f of the test signal $u_P$ is not only usable for completely determining the complex isolation impedance Z or only its real part $R_{iso}$ quantitatively. As the test signal $u_P$ comprises a continuous voltage course and does not comprise high frequencies, the measurement values $i_{Ab}$, $i_{Ab7}$, $i_{Ab8}$, $u_{Ab7}$, $u_{Ab8}$ as caused by the test signal, particularly the determined active current parts of the leakage currents, cannot comprise any steplike changes. If such steps occur in the measurement values, this is an indication of a sudden breakdown of the isolation of the input lines 7 and 8. Additionally, differentiating between $i_{Ab7}$ and $i_{Ab8}$ or $u_{Ab7}$ and $u_{Ab8}$ allows for at least roughly localizing any isolation fault. Here, the mesh rule may be separately applied for both input lines 7 and 8 of the inverter 3 according to FIG. 1 or the corresponding poles of the photovoltaic generator 2 according to FIG. 2, at least while the photovoltaic generator 2 does not shortcut the input lines 7 and 8. This is particularly the case during the night when there is no insolation. A localization of an isolation fault to the AC current side of the inverter 3 is possible by stopping the operation of the inverter and thus interrupting the (alternating) galvanic connection between its output lines 20 to 22 and the input lines 7 and 8. With an isolation fault on the AC current side of the inverter, the leakage current $I_{Ab}$ will then be reduced. For a further localization of an isolation fault on the AC current side, test signals may then be applied to the individual output lines 20 to 22 of the inverter 3 while resulting leakage currents are measured.

Many variations and modifications may be made to the preferred embodiments of the disclosure without departing substantially from the spirit and principles of the disclosure. All such modifications and variations are intended to be included herein within the scope of the present disclosure, as defined by the following claims.

The invention claimed is:

1. A method of monitoring an isolation of an ungrounded power grid, comprising:
    connecting an AC voltage source via at least one test resistor to the power grid,
    applying a test signal comprising a periodic continuous voltage course with regard to ground and a frequency to the power grid by means of the AC voltage source, where the test signal is a sine signal,
    measuring a leakage current flowing due to the test signal, and
    determining an ohmic isolation resistance from the measured leakage current,
    wherein the frequency of the test signal is varied such that an active current part of the leakage current keeps a predetermined recommended value at varying leakage capacitances of the power grid.

2. The method of claim 1, wherein the frequency of the test signal is varied according to a tracking method.

3. The method of claim 1, wherein the frequency of the test signal is repeatedly increased and/or decreased over an extended range of frequencies.

4. The method of claim 1, wherein the frequency of the test signal is continuously modulated.

5. The method of claim 1, wherein the amplitude of the test signal is modulated.

6. The method of claim 5, wherein the amplitude of the test signal is modulated such that:
    the electric power coupled in by the AC voltage source, or
    an absolute effective value of the active current part of the leakage current, or
    an absolute active power value of the electric power coupled in by the AC voltage source, or
    a relative active power value of the electric power coupled in by the AC voltage source and related to the entire electric value coupled in by the AC voltage source is kept constant.

7. The method of claim 1, further comprising determining a cross-correlation between the test signal and the leakage current.

8. The method of claim 1, further comprising:
    multiplying the leakage current by a reference function which is in phase with the test signal to form a product, and averaging the product over an integer number of periods of the reference function for determining the active current part of the leakage current, and/or
    multiplying the leakage current with a further reference function which has a phase offset with regard to the test signal of π/2 to form another product, and averaging the another product over an integer number of periods of the further reference function for determining a reactive current part of the leakage current.

9. The method of claim 1, further comprising indicating an isolation fault if the active current part of the leakage current exceeds a threshold value and/or if the leakage current and/or the active current part of the leakage current display a steplike change.

10. The method of claim 1, further comprising measuring and evaluating partial leakage currents from individual lines of the power grid, that are isolated with regard to each other, with regard to a location of a detected isolation fault.

11. The method of claim 10, wherein the partial leakage currents are directly measured between the AC voltage source and the individual lines of the power grid or indirectly by means of electric voltages of the individual lines with regard to ground.

12. The method of claim 1, wherein the AC voltage source is connected to the power grid on a DC current side of an inverter.

13. The method of claim 12, wherein the leakage current and/or partial leakage currents from individual lines of the power grid:
    are measured on the DC voltage side of an inverter, while the inverter is in operation, and
        while the inverter is not in operation, wherein one switch of a number of switches arranged in the lines is opened, or where the one switch is closed,
    and evaluated with regard to the location of a detected isolation fault.

14. An apparatus for monitoring an isolation of an ungrounded power grid, comprising:
    an AC voltage source configured to be connected to the power grid via at least one test resistor and generate a test signal having a periodic continuous voltage course with regard to ground, and having a frequency, where the test signal is a sine signal,
    one or more measurement devices configured to measure a leakage current flowing due to the test signal, and
    an evaluation device configured to determine an ohmic isolation resistance from the leakage current,
    wherein the AC voltage source is configured to vary the frequency of the test signal in such a way that an active current part of the leakage current keeps a predetermined recommended value at varying leakage capacitances of the power grid.

15. The apparatus of claim 14, wherein the AC voltage source is configured to vary the frequency of the test signal according to a tracking method.

16. The apparatus according to claim 14, wherein the AC voltage source is configured to repeatedly increase or decrease the frequency of the test signal over a range of frequencies.

17. The apparatus of claim 14, wherein the AC voltage source is configured to continuously modulate the frequency of the test signal.

18. The apparatus according to claim 14, wherein the AC voltage source is configured to modulate the amplitude of the test signal.

19. The apparatus according to claim 17, wherein the evaluation device is configured to determine a cross-correlation between the test signal and the leakage current.

20. The apparatus according to claim 14, wherein the evaluation device is configured to:
   multiply the leakage current by a reference function in phase with the test signal and average the product over an integer number of periods of the reference function for determining an active current part of the leakage current, and/or
   multiply the leakage current by a further reference function having a phase offset of $\pi/2$ with regard to the test signal and average the product over an integer number of periods of the further reference function for determining a reactive current part of the leakage current.

21. The apparatus according to claim 14, wherein the evaluation device is configured to indicate an isolation fault when the active current part of the leakage current exceeds a threshold value and/or when the leakage current and/or the active current part of the leakage current displays a steplike change.

22. The apparatus according to claim 14, wherein the one or more measurement devices are configured to measure partial currents flowing from the individual lines of the power grid which are isolated with regard to each other, and wherein the evaluation device evaluates the partial currents with regard to the location of a detected ground fault.

23. The apparatus according to claim 22, wherein the one or more measurement devices are configured to measure the partial currents directly between the AC voltage source and the individual lines of the power grid or indirectly by means of electric voltages of the individual lines with regard to ground.

* * * * *